United States Patent
Trantham et al.

(10) Patent No.: US 11,868,621 B2
(45) Date of Patent: Jan. 9, 2024

(54) DATA STORAGE WITH MULTI-LEVEL READ DESTRUCTIVE MEMORY

(71) Applicant: Seagate Technology LLC, Fremont, CA (US)

(72) Inventors: Jon D. Trantham, Chanhassen, MN (US); Praveen Viraraghavan, Chicago, IL (US); John W. Dykes, Eden Prairie, MN (US); Ian J. Gilbert, Chanhassen, MN (US); Sangita Shreedharan Kalarickal, Eden Prairie, MN (US); Matthew J. Totin, Excelsior, MN (US); Mohamad El-Batal, Superior, CO (US); Darshana H. Mehta, Shakopee, MN (US)

(73) Assignee: SEAGATE TECHNOLOGY LLC, Fremont, CA (US)

(*) Notice: Subject to any disclaimer, the term of this patent is extended or adjusted under 35 U.S.C. 154(b) by 11 days.

(21) Appl. No.: 17/844,174

(22) Filed: Jun. 20, 2022

(65) Prior Publication Data
US 2022/0404982 A1  Dec. 22, 2022

Related U.S. Application Data

(60) Provisional application No. 63/213,240, filed on Jun. 22, 2021.

(51) Int. Cl.
G06F 3/06 (2006.01)
G11C 29/08 (2006.01)

(52) U.S. Cl.
CPC .......... *G06F 3/0616* (2013.01); *G06F 3/0653* (2013.01); *G06F 3/0679* (2013.01); *G11C 29/08* (2013.01)

(58) Field of Classification Search
CPC .... G06F 3/0616; G06F 3/0653; G06F 3/0679; G11C 29/08; G11C 11/22–2297; G11C 11/5657
See application file for complete search history.

(56) References Cited

U.S. PATENT DOCUMENTS

| | | | |
|---|---|---|---|
| 5,495,438 A | 2/1996 | Omura | |
| 6,914,853 B2 | 7/2005 | Coulson | |
| 7,372,718 B2 | 5/2008 | Nagao et al. | |
| 8,315,081 B2* | 11/2012 | Rao | G11C 11/1657 365/158 |
| 8,422,303 B2 | 4/2013 | Franca-Neto et al. | |
| 8,913,449 B2 | 12/2014 | Chung | |
| 9,430,735 B1 | 8/2016 | Vali et al. | |
| 10,038,092 B1* | 7/2018 | Chen | H10B 53/20 |
| 10,797,237 B2 | 10/2020 | Liu et al. | |

(Continued)

*Primary Examiner* — William E. Baughman
(74) *Attorney, Agent, or Firm* — HOLZER PATEL DRENNAN (57) ABSTRACT

A data storage system can employ a read destructive memory configured with multiple levels. A non-volatile memory unit can be programmed with a first logical state in response to a first write voltage of a first hysteresis loop by a write controller prior to being programmed to a second logical state in response to a second write voltage of the first hysteresis loop, as directed by the write controller. The first and second logical states may be present concurrently in the non-volatile memory unit and subsequently read concurrently as the first logical state and the second logical state.

20 Claims, 6 Drawing Sheets

(56) References Cited

U.S. PATENT DOCUMENTS

| | | | |
|---|---|---|---|
| 11,048,643 B1 | 6/2021 | Lercari et al. | |
| 2003/0002368 A1* | 1/2003 | Kang | G11C 29/50 |
| | | | 365/201 |
| 2004/0042286 A1* | 3/2004 | Kato | G11C 11/22 |
| | | | 365/200 |
| 2006/0279977 A1* | 12/2006 | Shiga | G11C 11/22 |
| | | | 365/145 |
| 2010/0195369 A1* | 8/2010 | Zhao | G11C 11/22 |
| | | | 365/189.14 |
| 2018/0082729 A1* | 3/2018 | Slesazeck | G11C 11/5657 |
| 2018/0277550 A1* | 9/2018 | Yoo | H01L 29/78391 |
| 2019/0147935 A1* | 5/2019 | Yoo | G11C 11/5657 |
| | | | 365/145 |
| 2020/0133669 A1* | 4/2020 | Qawami | H03K 19/0005 |
| 2020/0357453 A1* | 11/2020 | Slesazeck | G11C 11/2255 |
| 2021/0098034 A1* | 4/2021 | Mantegazza | G11C 8/08 |
| 2021/0125656 A1* | 4/2021 | Müller | G11C 11/223 |
| 2022/0157376 A1* | 5/2022 | Franklin | G11C 11/1659 |

* cited by examiner

DATA STORAGE WITH MULTI-LEVEL READ DESTRUCTIVE MEMORY

RELATED APPLICATION

The present application makes a claim of domestic priority under 35 U.S.C. 119(e) to U.S. Provisional Patent Application No. 63/213,240 filed Jun. 22, 2021, the contents of which are hereby incorporated by reference.

SUMMARY

The present disclosure is generally directed to a memory employing multi-level read destructive memory cells.

In some embodiments, a memory consists of a non-volatile memory unit programmed with a first logical state in response to a first write voltage of a first hysteresis loop prior to being programmed to a second logical state in response to a second write voltage of the first hysteresis loop, as directed by a write controller. The first and second logical states are concurrently present in the non-volatile memory unit and subsequently read concurrently as the first logical state and the second logical state.

A memory, in accordance with various embodiments, is programed with different first and second logical states, as directed by a write controller, with the first logical state corresponding with a first hysteresis loop and the second logical state corresponding with a second hysteresis loop while the first and second logical states are each concurrently present. A wear circuit then determines a wear condition is present and a manipulation circuit alters at least one operational parameter of the non-volatile memory unit to mitigate operational degradation corresponding with the wear condition.

Other embodiments involve programming different first and second logical states, as directed by a write controller, to a non-volatile memory unit with the first logical state corresponding with a first hysteresis loop and the second logical state corresponding with a second hysteresis loop while the first and second logical states are each concurrently present. A monitor circuit monitors a health of at least one non-volatile memory unit by evaluating logged activity for a first group of non-volatile memory units before predicting a wear condition is present in a non-volatile memory unit of the first group of non-volatile memory units.

DETAILED DESCRIPTION

Generally, the present disclosure has embodiments directed to the intelligent use of multi-level read destructive memory cells as part of a data storage system.

As data generation and transmission have proliferated everyday life, greater volumes of data are being stored and retrieved. Traditional rotating data storage provided reliable data access, but suffered from relatively large form factors and slow data performance. The use of solid-state memory provided smaller form factors and relatively faster data storage performance, but suffered from a finite lifespan tied to the number of data write cycles experienced by a memory cell. Advancements in solid-state memory have further reduced the form factor of memory and increased the data access performance capabilities. However, cutting edge solid-state memory can suffer from wear over time that degrades data access performance, often times unexpected and in a non-linear progression.

These issues have prompted various embodiments of a data storage system to employ read destructive solid-state memory cells in a multi-level cell (MLC) configuration that is intelligently managed by an MLC module to control wear and provide optimized data access performance over time. The use of two differently constructed read destructive memory cells in a memory unit provides more than two stable logic states, which increases data storage density and provides greater data capacity than single level cells (SLC) that employ a single read destructive memory cell. Through the monitoring and management of the hysteresis loops for the respective memory cells of an MLC memory unit, an MLC module can adapt to changing operational conditions in both individual memory cells and arrays of memory cells due to wear and host initiated data flow.

Figure 1:
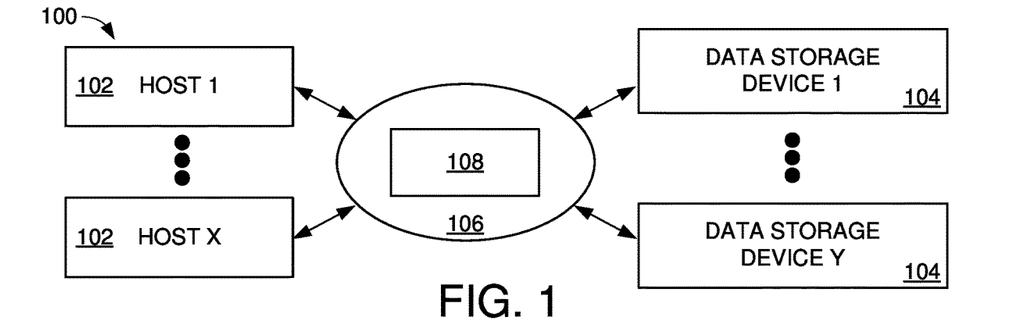
FIG. 1 provides a functional block representation of a data storage system in which various embodiments can be practiced.

An example data storage system 100 in which assorted embodiments of an MLC memory unit and cell can be utilized in depicted as a block representation in FIG. 1. The data storage system 100 connects any number (X) of hosts 102 to any number (Y) data storage devices 104 via one or more wired and/or wireless networks 106. The various hosts 102 can be positioned in any location with any type, performance, and capability to create, transfer, and receive data stored in one or more data storage devices 104. The assorted data storage devices 104 are not limited to a uniform configuration and can have any capacity, performance capability, and type of memory to store data. It is contemplated that the respective data storage devices 104 employ non-volatile memory, such as solid-state memory cells and/or rotating magnetic media, that are employed by a network controller 108 to satisfy data access requests from one or more hosts 102.

Figure 2:
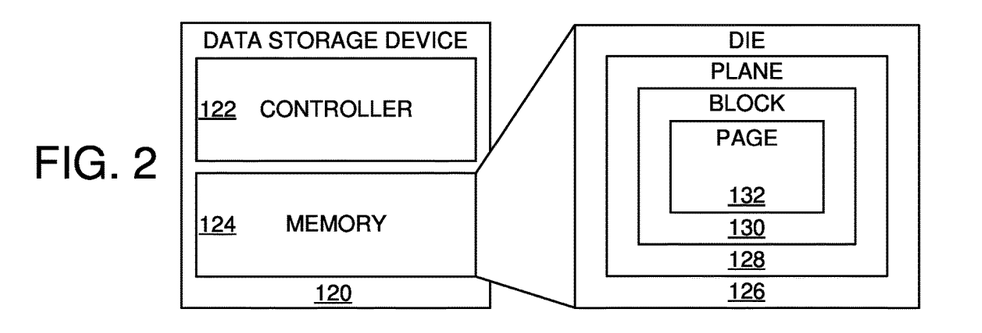
FIG. 2 depicts a block representation of portions of an example data storage device capable of being used in the data storage system of FIG. 1 in some embodiments.

FIG. 2 depicts a block representation of portions of an example data storage device 120 that may be utilized in the data storage system 100 of FIG. 1. The data storage device 120 has a local controller 122 that directs operation of one or more memories 124 to store, and retrieve, data in response to requests from one or more external hosts 102. A memory 124, in some embodiments, consists of non-volatile, solid-state type data storage cells that can be individually written or read. As shown, the assorted cells of a memory 124 can be logically and/or physically arranged into two-dimensional or three-dimensional die 126, planes 128, blocks 130, and pages 132 that are each collectively accessible at once. That is, a single die 126, plane 128, block 130, or page 132 can be read, or written, in a single instance, which provides efficient ingress and egress of data.

Figure 3A:
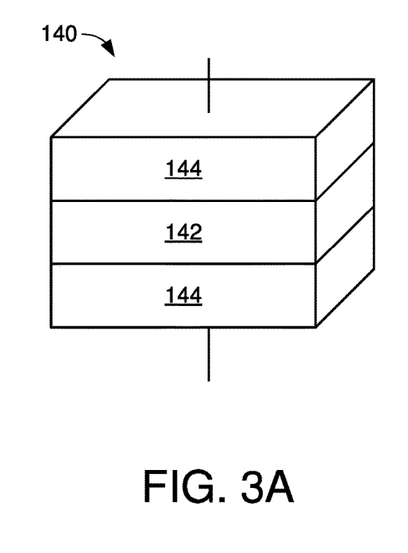
FIGS. 3A & 3B respectively show aspects of an example memory configured in accordance with some embodiments.
Figure 3B:
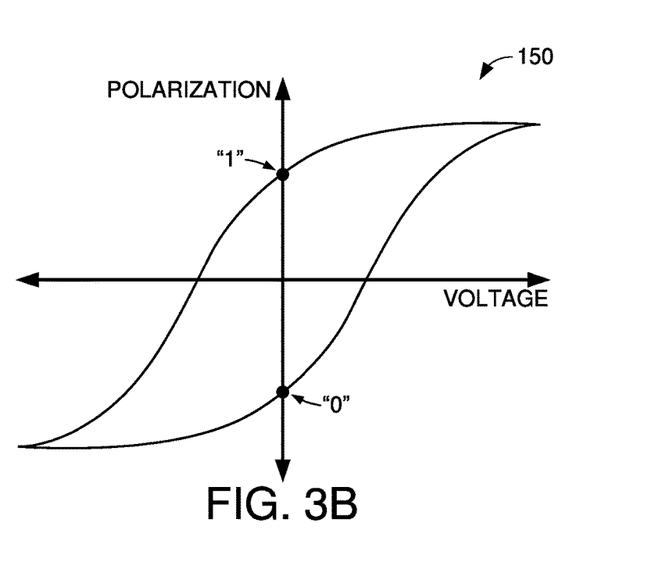

FIGS. 3A and 3B respectively illustrate assorted aspects of an example solid-state memory cell 140 that may be employed in a data storage device 120 and data storage system 100 to carry out various embodiments. FIG. 3A is a block representation of a solid-state non-volatile memory cell 140 that can be used to store host-generated data. Some embodiments of the memory cell 140 are a ferroelectric memory element (FME) that uses at least one ferroelectric film 142 to facilitate stable polarizations that logically represent at least one pair of "1" and "0" states. It is contemplated that the memory cell 140 uses capacitors, transistors, multiple ferroelectric layers, and/or multiple electrodes 144, such as ferroelectric tunnel junctions and ferroelectric field effect transistors, to enable a stable polarization when programmed with a predetermined electric field. Although a single FME is shown in FIG. 3A, various embodiments interconnect multiple separate cells 140 as part of a 2D or 3D page/block/plane/die all while allowing individual FME to be accessed at one time.

FIG. 3B is an example hysteresis loop 150 for the FME 140 that illustrates how the cell 140 reacts to different applied voltages. The reliability and repeatability of the hysteresis loop 150 provides an FME 140 with the ability to be used for various types and sizes of data. In addition, the configuration of the memory cell 140 as an FME provides density capabilities, data access speeds, and power savings that are better than flash memory, exhibit greater rewriting capabilities than dynamic random access memory, and are conducive to next-generation data storage devices and systems. However, most FME 140 structural configurations are read destructive and do not retain a programmed state/polarization once accessed during a read operation. An FME memory cell 140 also can suffer from wear that alters, and potentially, degrades the ability of the cell 140 to reliably be programmed and/or read.

Figure 4A:
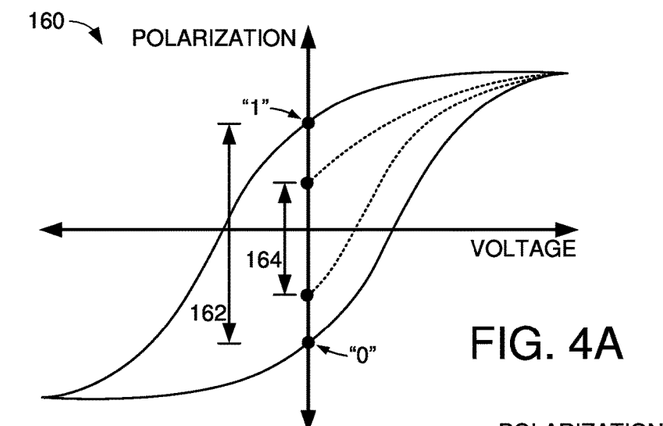
FIGS. 4A-4C respectively illustrate operational information for memory operated in accordance with assorted embodiments.
Figure 4B:
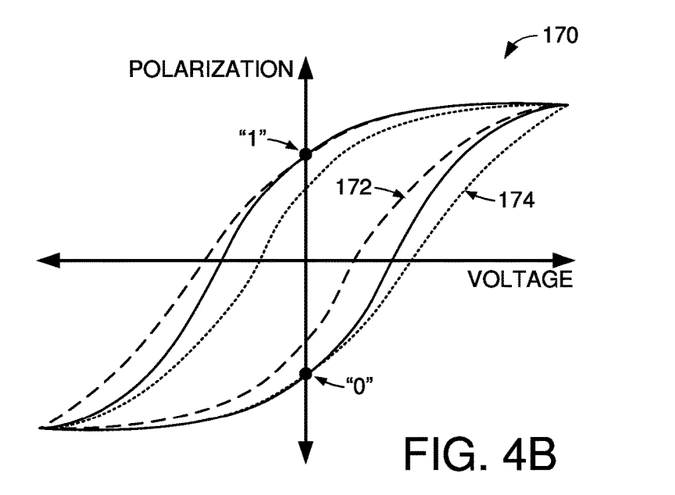
Figure 4C:
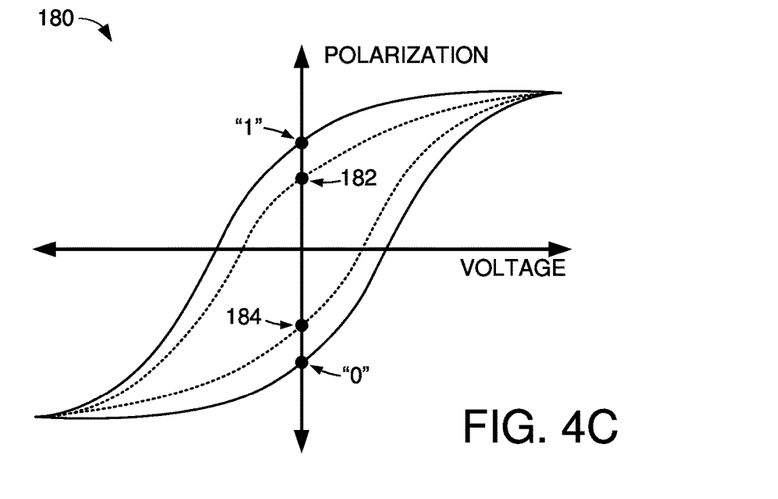

FIGS. 4A-4C respectively depict example hysteresis loops for different FME memory cell wear conditions. FIG. 4A displays a depolarization condition 160 with segmented lines where less polarization is experienced at a steady state, zero voltage. Such a decrease in polarization for one, or both, logical states (I/O) reduces the margin between the states, as shown by the difference between the original margin 162 and the depolarized margin 164. The reduced depolarized margin 164 can be the result of an FME cell experiencing relatively high (>70° C.) heat for short, or long, periods of time, which can increase that error rate for data reads as the difference between logical state polarizations is smaller.

FIG. 4B displays an imprint condition 170 that corresponds with an FME memory cell becoming resistive to reversals in polarization. The imprint condition 170, as shown by segmented lines, can involve a leftward 172, or rightward 174, shift in portions of the hysteresis loop. A practical result of the imprint condition 170 is degraded data writing as sufficient write voltage may not be used for a logical state reversal due to a loop shift. It is noted that an imprint condition 170 can be related to the amount of time a cell has been programmed in a single logical state, the number of times a cell has been written to a particular logical state. Imprint can be particularly degrading for data writing performance as the shifting of the hysteresis loop can occur gradually and may be difficult to detect unless dynamic write voltages are used over time.

In FIG. 4C, a hysteresis loop 180 conveys a fatigue condition for an FME where repeated reversals in programmed polarization correspond with a decrease in the polarization of the ferroelectric aspects of a memory cell. Segmented lines convey how the entire hysteresis loop 180 shrinks as a result of fatigue and reduces the polarization value for each logical state. Indeed, the decrease in polarization to states 182 and 184, as shown, can occur with the cyclic reading of a memory cell, not just cyclic writing, which adds complexity to the detection and correction of a fatigue condition. Much like the depolarization of portions of the hysteresis loop 160 in FIG. 4A, fatigue condition logical states 182/184 can be error-prone due to the relatively small margin between the states 182/184.

Figure 5:
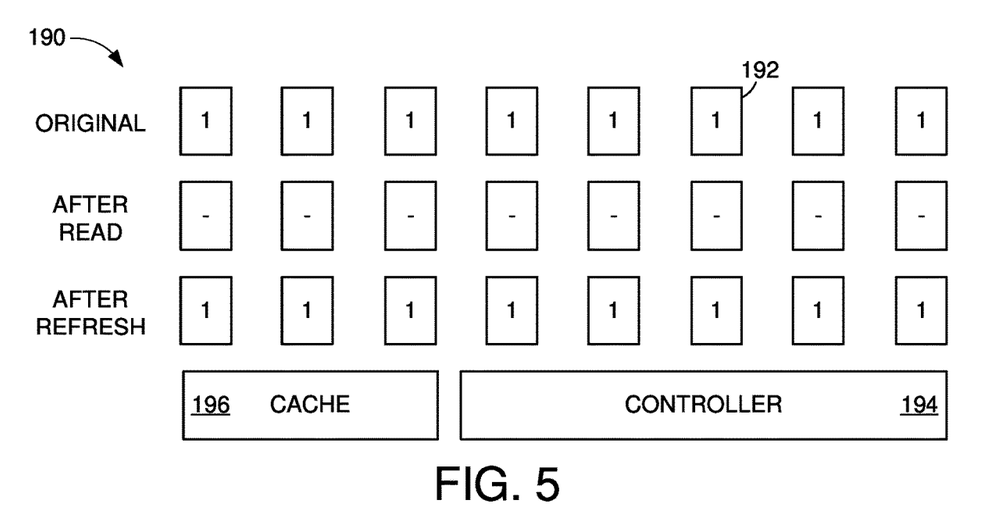
FIG. 5 depicts a block representation of aspects of an example memory employed in accordance with various embodiments.

With the assorted memory cell wear issues presented by depolarization, imprint, and fatigue conditions, simple utilization of memory cells over time can result in degraded reliability that jeopardizes the applicability of a memory for many industrial, commercial, and personal data storage applications. FIG. 5 depicts a block representation of portions of a data storage device 190 operated in accordance with some embodiments. A plurality of FME memory cells 192 are originally programmed with assorted logical states (0/1), as shown. However, the structural capabilities of the FME cells 192 cause each programmed state to be erased as the polarization of each cell 192 approaches zero, which renders each cell without a programmed state (-) that can be consistently read by any computing means.

While the originally programmed states can be read by a local, or remote, controller 194 before the respective cells 192 become unreadable, the controller 194 can be tasked with refreshing the programmed states to the respective cells 192 by conducting one or more write operations. In comparison to other, non-read destructive solid-state memory cells that can conduct a read operation without refreshing the programmed states with a write operation, FME cells 192 experience greater volumes of write operations as outputted data from a read operation is refreshed by the controller 194 from a local cache 196 or some other data storage location. Such cell writing activity can produce relatively high volumes of heat while consuming relatively large amounts of power and processing time compared to other types of memory. The addition of cell 192 health and wear being difficult to track and/or detect makes FME memory cell usage over time difficult and unreliable with current operation and management.

These issues have prompted the use of a module that intelligently tracks activity of read destructive solid-state non-volatile memory cells to determine the presence, type, and severity of wear. The module can further generate one or more strategies that can repair, mitigate, or balance the presence of cell wear and allow a system to efficiently mitigate the proliferation of wear in a memory unit while maximizing unit performance despite the presence of operational wear that changes a cell's hysteresis loop. The ability to intelligently detect and/or predict memory cell, and unit, wear and transition to different customized cell/unit operating stages prevents processing bottlenecks associated with reactive detection of memory cell wear followed by generation of operating parameters to optimize the performance, longevity, and reliability of cells/units experiencing a wear condition.

Figure 6:
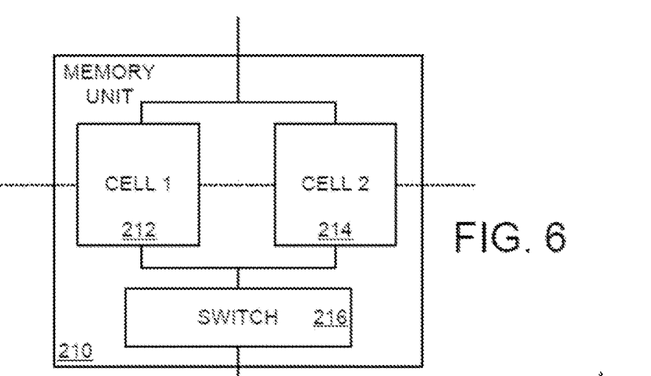
FIG. 6 depicts a block representation of portions of an example multi-level read destructive memory unit configured in accordance with various embodiments.

FIG. 6 conveys a block representation of portions of an example memory unit 210 that can be employed in a data storage system in some embodiments as part of a solid-state memory array. Although a memory array can utilize single level cells that consist of a single lamination of polarization retaining materials, the memory unit 210 of FIG. 6 concurrently employs at least two separate laminations of polarization retaining materials with a first cell 212 and a second cell 214. The respective memory cells 212/214 may have matching, or dissimilar, physical constructions and/or operational configurations that provide the memory unit 210 with simultaneously operating different hysteresis loops while being connected in parallel (solid lines) or series (segmented lines).

In a non-limiting example, each memory cell 212/214 may generally have a ferroelectric physical construction with different operational characteristics due to different physical constructions. It is contemplated that the memory cells 212/214 have redundant operational characteristics that may correspond with different physical constructions. The first memory cell 212 may be a ferroelectric stack of materials while the second memory cell 214 is an antiferroelectric stack of materials, which can provide diverse hysteresis loop size and/or shape that may be conducive to peak data write and/or data read performance while providing robust resiliency to memory cell wear. Other embodiments can utilize ferroelectric tunnel junctions (FTJ), ferroelectric field effect transistors (FeFET), and/or ferroelectric capacitors (FC) with one or more transistors acting as a switch 216.

Figure 7:
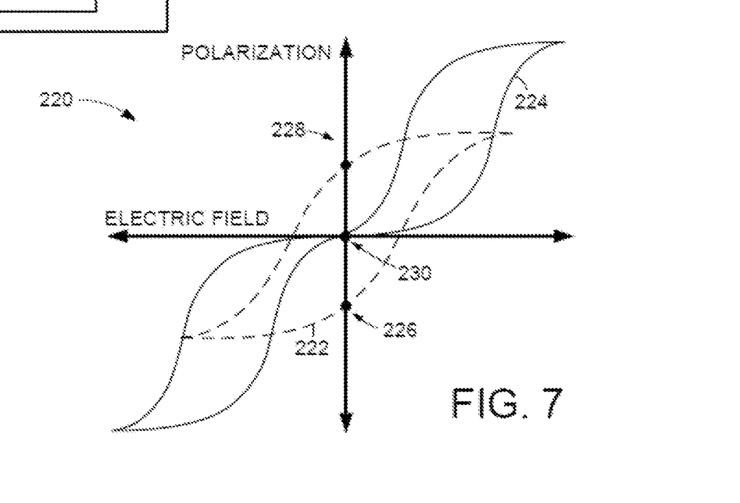
FIG. 7 plots hysteresis loops for an example multi-level memory cell arranged in accordance with assorted embodiments.

FIG. 7 plots hysteresis loops for an example memory unit 220 employing an MLC configuration consisting of two memory cells constructed with different operating characteristics. The segmented line hysteresis loop 222 corresponds with a first memory cell while the solid line hysteresis loop 224 corresponds with a second memory cell. While not limiting, the first memory cell 222 is a ferroelectric type of memory and the second memory cell 224 is an antiferroelectric type of memory. The physical construction of the layers of the ferroelectric first memory cell 222 produces two stable logic states corresponding with a low polarization 226 and a high polarization 228. Conversely, the antiferroelectric second memory cell 224 produces a single stable polarization 230 with zero electric field present.

It is contemplated that the antiferroelectric second memory can be biased so that multiple stable polarizations are possible with zero electric field. However, the unbiased example antiferroelectric second memory cell 224 exhibits a third polarization 230 that can correlate with a logic state that can complement the two logic states corresponding to the polarizations 226/228 of the first memory cell 222. When read together, the memory cells 222/224 can provide three different states that can be read with a single read voltage. It is noted that the different hysteresis sizes and shapes of the respective memory cells 222/224 correlate with different responses to write voltages that can independently be read with different read voltages to the respective memory cells 222/224. As a result, three different write voltages can be used to write the respective first 226, second 228, and third 230 polarizations.

In embodiments where multiple ferroelectric type memory cells are used for a memory unit, different physical cell configurations can position the hysteresis loops so that four different stable polarizations are possible with a zero electric field present. Such a dual ferroelectric type memory cell can be written with four different reference write voltages and read with two different reference read voltages, which allows for control of the heat produced and power consumed to write/read four different logic states (00/11/10/01). The use of different read and write reference voltages for respective memory cells further controls cell wear as a cell experiencing a wear condition can have altered read/write voltages without impacting the performance or reliability of the other memory cell of a memory unit.

Figure 8:
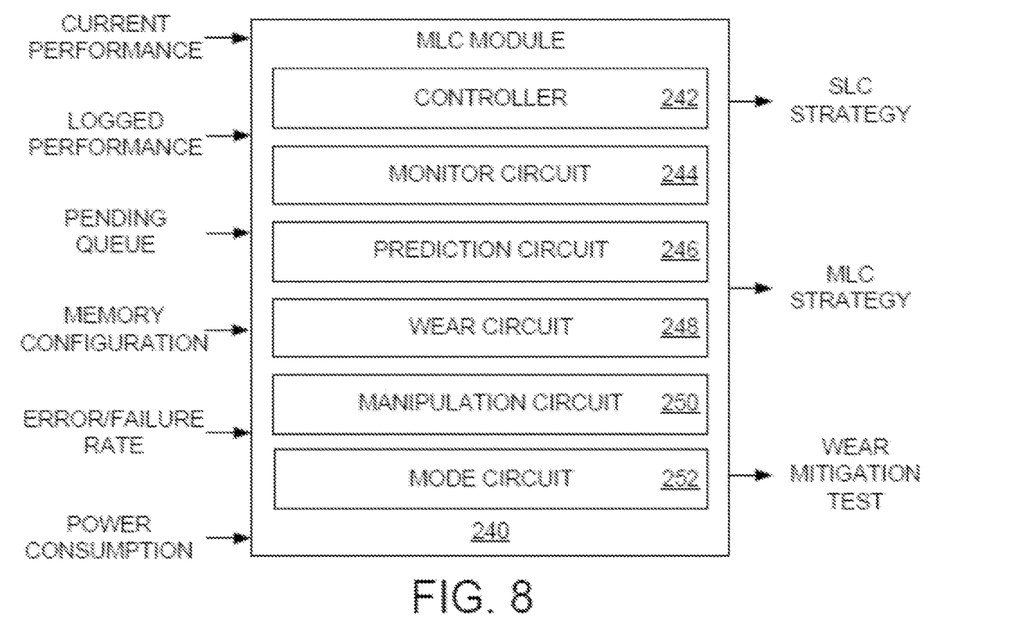
FIG. 8 depicts a block representation of an example MLC module that can be employed in a data storage system in accordance with various embodiments.

Although an MLC memory unit can provide greater data density and increased control of wear, the identification of wear and execution of MLC memory unit reading and writing to control wear can be complex and diverse. Hence, embodiments of a data storage system employing read destructive MLC memory units have an MLC module to monitor wear, generate wear control strategies, and execute actions prescribed in strategies to provide peak data access performance, increased memory lifespan, or greater performance balance across memory units. FIG. 8 conveys a block representation of an example MLC module 240 that can be utilized in a data storage system to provide intelligent wear detection and control for multi-level memory units configured with read destructive memory cells.

The MLC module 240 can utilize a controller 242, such as a microprocessor or other programmable circuitry, to evaluate past and current memory conditions, operation, and performance to identify the health of FME memory cells and generate wear verification tests and wear mitigation strategies customized to particular cells and groups of cells. The MLC module 240 that can be present as software and/or hardware in a data storage device, in a network component, such as a server or node, or in a remote host. One or more controllers 242 that translate assorted input information into at least an MLC strategy, SLC strategy, and wear mitigation strategy customized to particular memory cells, such as particular physical block addresses in a memory array. That is, a controller 242 can diagnose current and future FME cell wear and generate deviations in MLC memory unit operating parameters to provide optimized single level cell performance, multi-level cell performance, and/or management of how wear impacts data storage performance over time. Accordingly, operation of the MLC module 240 proactively and/or reactively controls MLC memory unit wear conditions to increase the performance, longevity, or consistency of memory cell/unit operation despite the presence of memory cell/unit wear.

Although not required or limiting, the MLC module 230 can input past logged performance of FME memory cells, current detected performance of FME memory cells, how the FME memory cells are configured and calibrated, past and current error/failure rate of FME memory cells, pending data access commands to the FME memory cells, and power consumption for assorted data read and write operations to determine the current health of one or more FME memory cells and generate strategies that mitigate, prevent, and/or repair the health of at least one memory cell. The controller 242 can operate alone, or in combination with other module 240 circuitry, to translate the various input information into the current health of memory cells and the assorted strategies and tests.

A monitor circuit 244 can be used to track data access operations and performance of at least one memory cell to detect deviations from healthy FME memory cell operation without the presence of a wear condition, such as the conditions of FIGS. 4A-4C. The monitor circuit 244 can correlate experienced errors, cell access latency, and heat to a suspicion of FME cell health degradation and, possibly, a particular wear condition being present. It is contemplated that the monitor circuit can track activity to FME cells with dynamic resolution in response to detected errors, heat, and deviation from expected access latency. Such dynamic resolution may track cell activity with other cells of a die/plane/block/page in a first resolution before honing in on a particular cell address or page in a tighter second resolution.

The ability to adjust how and what activities are tracked by the monitor circuit 244 allows the controller 242 to control the volume of processing power and time that is consumed with trying to ascertain the health of FME memory cells. Adjustment of system resources being consumed further allows data addresses storing sensitive data to be tracked with tighter resolution than other addresses storing less sensitive data. The monitor circuit 244 can correlate current, real-time data access operations and performance with the reference voltages, latencies, and error rates set by the controller 242 to determine if a health related deviation is occurring. That is, the controller 242 can generate one or more wear hypothetical parameters that correspond deviations from expected operating conditions to FME wear conditions.

While the controller 242 can operate with the monitor circuit 244 to set, and adjust, the reference voltages to satisfy pending data access requests with data read and/or write operations, some embodiments generate deliberate operational alterations to test and/or verify the presence of a deviation in health for an FME memory cell. For instance, the controller 242 can prescribe using reference voltages for reading and/or writing data that allows for the determination that a cell has degraded health and/or a wear condition. It is noted that the deliberate operational alterations can be conducted to satisfy pending data access requests, but with less than maximum performance, such as lower latency and/or greater production of heat.

In non-limiting embodiments of the MLC module 240, the controller 242 prescribes a plurality of different deliberate operational alterations as part of an SLC strategy, MLC strategy, or wear mitigation strategy to allow for the detection and characterization of FME memory cell health degradation as well as the prediction of future health degradation with a prediction circuit 246. It is contemplated that the controller 242 can prescribe specific, non-operational deliberate alterations to FME cell parameters to conclusively identify and characterize health degradation. However, the non-operational testing may be reserved for particularly drastic wear conditions and the MLC module 240 may attempt to keep using operational alterations that can satisfy host-generated data access requests so that a host does not experience a lag or pause in the operation of a memory.

The prediction circuit 246 may operate to translate current and/or past FME memory cell operating conditions into future operating conditions, parameters, and health degradation. One or more wear strategies can be populated by the prediction circuit 246 with several different predicted health degradations corresponding to changes in FME memory cell operation. For example, the prediction circuit 246 can forecast how different changes in FME operation, such as with different read latency, error rate, heat generation, and write latency, can indicate health degradation and, potentially, the presence of a particular wear condition. Such correlation of FME memory cell operational deviations with health degradation allows the health strategies to prescribe more intensive testing to verify the presence of health degradation and/or actions to mitigate and/or repair the health degradation without ever conducting a memory cell test that does not service a pending data access request.

In the event the MLC module 240 wants to test an FME memory cell other than during the satisfaction of pending data access requests, the controller 242 can generate one or more tests to efficiently consume processing power and time to determine the presence and type of health degradation. That is, once the controller 242 identifies that a health degradation may be present by altering the operating characteristics during the satisfaction of host-generated data access requests, one or more tests from the controller 242 can verify and characterize any health degradation by taking some, or all, of an FME memory offline temporarily as artificial test patterns generated by the controller 242 are used to plot some, or all, of a hysteresis loop for an FME memory cell.

Through the intelligent use of deviating operational FME memory cell parameters to indicate health degradation and cell conducing health tests generated by the controller 242, the MLC module 240 can reliably and efficiently determine that the health of particular memory cells has changed. Either when health degradation is expected or verified, the MLC module 240, through the assorted health strategies, can choose to repair or mitigate the change in FME operation and/or capabilities. The prediction of future health degradations may additionally allow the MLC module 240 to prevent a wear condition from occurring and/or becoming permanent.

It is noted that the presence of heat can exacerbate the degradation of cells and the occurrence of some wear conditions. Hence, the MLC module 240 can monitor the volume and presence of heat around assorted FME memory cells. The logging of heat can be useful for other module 240 circuitry to detect current susceptibilities to health degradation and wear conditions as well as accurately predicting future data access operations, patterns, and activity that could threaten, or exacerbate, FME memory cell wear. For instance, the controller 242 can identify physical and logical data addresses where heat is localized in a memory array along with where the generated heat travels to potentially compound data access activity and threaten the health and operating consistency of one or more FME memory cells.

While some embodiments assume a predicted wear condition is present in a memory cell without conducting a wear verification test, other embodiments rely on the verification of a wear condition and severity determined by the wear circuit 248 prior to generating any strategies that handle MLC memory unit operation or mitigate the proliferation of wear. The identification of the type and severity of wear in a memory cell/unit with the wear circuit 248 allows operational strategies generated with the MLC module 240 to be customized for particular memory cell and memory units. As a result, the MLC module 240 may generate and maintain numerous different strategies catered to particular cells, units, or groups of units.

The characterization of wear with the wear circuit 248 can contribute to what operational deviations can be taken to maximize memory unit performance, mitigate the proliferation of wear, extend memory unit lifespan, and balance unit performance across a memory array. A manipulation circuit 250 can cooperate with the wear circuit 248 and module controller 242 to populate one or more strategies with operational manipulations that are directed to increase memory cell, and memory unit, performance with, or without, the presence of wear. For instance, the manipulation circuit 250 can prescribe actions to alter a memory cell's hysteresis loop, which can repair memory cell wear and/or increase the margin between stable polarizations for a memory cell.

The manipulation circuit 250 can translate a variety of sensed and predicted memory cell information to create a wear mitigation strategy customized for the cell(s) experiencing wear. The mitigation circuit 250, in some embodiments, prescribes deviations in memory cell operating parameters to repair wear and return a cell to a default hysteresis loop, increase a margin between stable logic states, and/or balance operating performance for a plurality of cells, such as a page, block, or namespace of memory cells. The manipulation of a cell's hysteresis loop can entail performing host-generated or module-generated data writes and/or reads to deliberately change the shape and/or size of a hysteresis loop. It is contemplated, but not required, that the manipulation circuit 250 prescribes the accumulation of heat around the physical location of a memory cell to facilitate the alteration of a cell's hysteresis loop.

Through the alteration of portions of memory cell's hysteresis loop, wear can be corrected, MLC reliability can be increased, and SLC operation can be optimized for performance, such as write and/or read latency. The proactive generation of memory cell operational alterations in the respective strategies allows for efficient and accurate execution that prevents the proliferation of wear and/or the sub-optimal servicing of host-generated data access requests.

Some embodiments of the assorted strategies generated by the MLC module 240 pursue a particular goal with deviations from default memory cell/unit operating parameters. A mode circuit 252 can evaluate a variety of different possible goals possible for an MLC memory unit, such as increased reliability, reduced data access latency, or greater performance consistency among different memory units, to correlate goal-directed strategy actions to triggers encountered during the servicing of host-generated data access requests. That is, the mode circuit 252 can create alterations from memory cell/unit default operational parameters, such as reference voltages, refresh rates, garbage collection times, and error correction, directed to a goal chosen by the mode circuit 252, such as peak performance, reduced error rate, or greater performance consistency, and initiated in response to a trigger chosen by the mode circuit 252, such as presence of a type of wear, severity of wear, length of time for data retention, or number of read/write cycles.

Figure 9A:
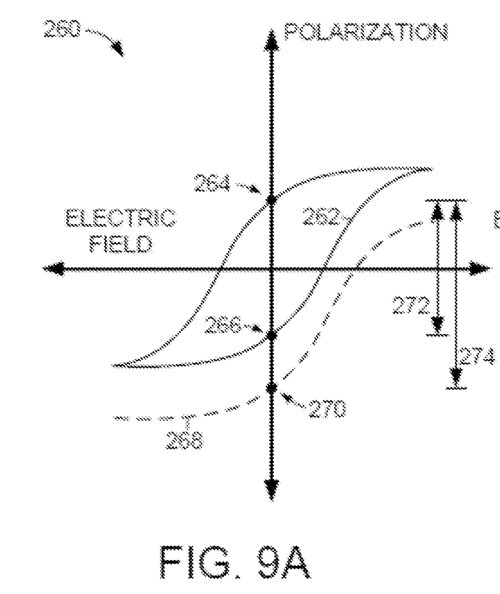
FIGS. 9A & 9B respectively plot hysteresis loops for example MLC memory unit that may be utilized in accordance with some embodiments.
Figure 9B:
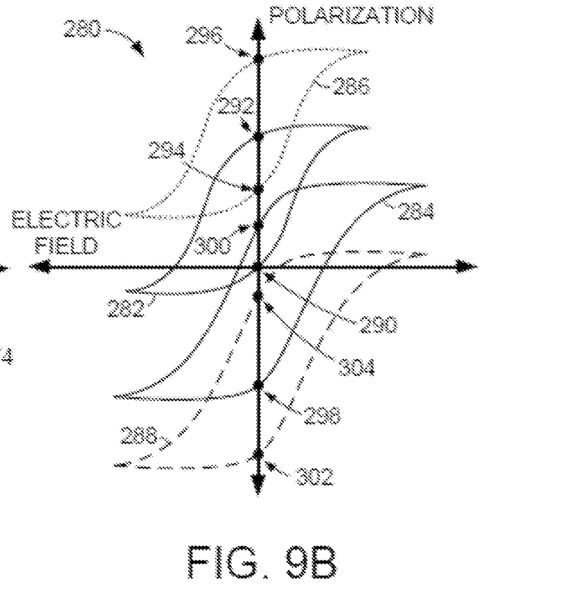

FIGS. 9A & 9B respectively plot example hysteresis loops for memory units 260/280 that execute various aspects of at least one strategy generated by the MLC module to alter and optimize memory unit operation. The memory unit 260 of FIG. 9A conveys how a memory cell with a default hysteresis loop 262 and initially stable polarizations 264/266 can undergo one or more hysteresis manipulations from an SLC strategy, MLC strategy, or a wear mitigation strategy, such as accumulation of heat, writing module-generated data to the cell, reading the cell without a host-generated request, or rewriting data to the cell without a host-generated request, to move a portion of the loop 262 to a manipulated position 268, as shown.

The new hysteresis loop position provides a lower stable polarization 270 that changes the polarization margin from a first distance 272 to a greater second distance 274, which allows for greater data reliability and lower reference read voltages. It is noted that different hysteresis actions can be utilized to alter other portions of the hysteresis loop 262 to change how the memory cell reacts to write voltages. The ability to manipulate portions of a hysteresis loop 262 can be used to increase SLC or MLC memory unit performance with, or without, the presence of wear. That is, hysteresis manipulation can optimize memory unit performance by repairing wear conditions and/or increasing polarization margin.

The manipulation of hysteresis loops can be particularly effective in an MLC memory unit. FIG. 9B conveys how an example memory unit 280 can employ a first memory cell, as represented by loop 282, concurrently with a second memory cell, as represented by loop 284. It is noted that the first and second memory cells are differently constructed, as shown by the different hysteresis loop sizes and shapes. The execution of one or more strategies can manipulate the first hysteresis loop to a greater polarization position, as shown by loop 286, and a second hysteresis loop to a lower polarization position, as shown by loop 288.

While a single loop manipulation can be conducted without altering the second loop, the loop manipulation illustrated in FIG. 9B can increase the stable, zero electric field polarization margin and/or separation to optimize memory unit performance, mitigate the presence of wear conditions, or prevent wear conditions from impacting memory unit performance over time. The ability to manipulate portions of a hysteresis loop without altering all of a loop further allows for individual stable polarization movement to customize polarization separation and margin.

Figure 10:
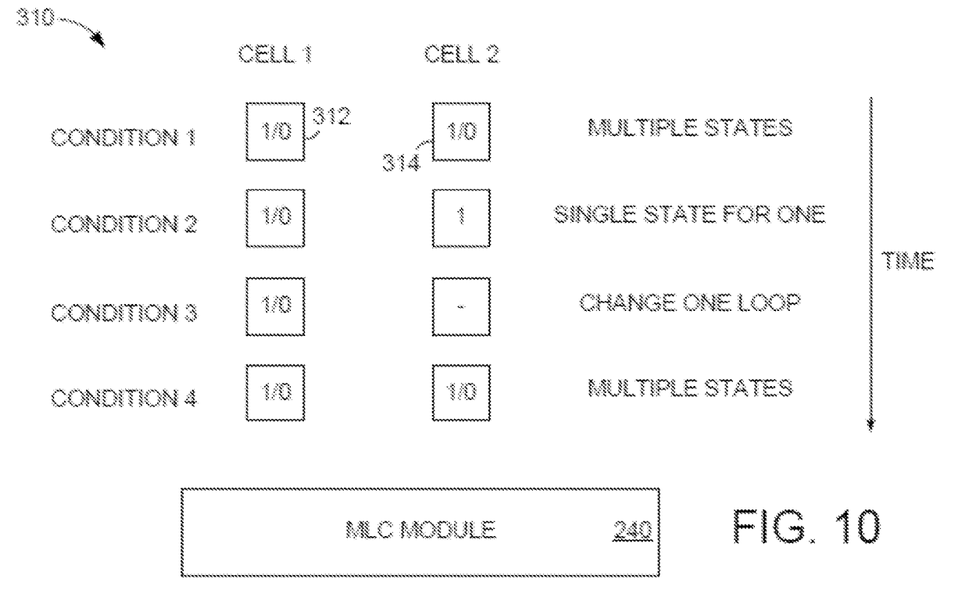
FIG. 10 depicts portions of an example data storage system operated in accordance various embodiments.

FIG. 10 depicts a block representation of portions of an example data storage system 310 operated in accordance with various embodiments. With the analysis of MLC memory units and the generation of at least one MLC strategy that prescribes alterations from memory cell default parameters, the MLC module 240 can execute one or more operational alterations at any time, such as in response to a trigger identified by the MLC strategy, such as number of data writes, number of data reads, intensity of heat over time, or time at one polarization.

In the non-limiting example conveyed by FIG. 10, the MLC module 240 executes a preexisting MLC strategy that calls for a default first condition to be maintained where each memory cell 312/314 of a memory unit is allowed two different polarizations and corresponding logic states, as shown. Upon detecting, or predicting, a change in memory cell operating capability or trigger event with respect to volume of pending host-generated data access requests, the MLC module 240 may transition one or more memory units to a second condition where a selected memory cell 314 is restricted to a single polarization, which limits the memory unit to three logical states with the dual polarization possibility in the non-selected memory cell 312. Such restriction of a memory cell to a single polarization can mitigate the generation of a wear condition and/or the generation of heat. It is contemplated that the single polarization for the selected memory cell changes from a high value to a low value, or vice versa.

It is noted that the length of time a memory unit stays in a condition is not limited and can continue indefinitely. However, an MLC strategy may prescribe lengths of time, performance triggers, and/or operational triggers to transition between conditions, or return to a default first condition.

It is also noted that an MLC strategy can prescribe any order of memory unit condition, such as advancing from the first condition to a third condition. As the MLC module 240 proceeds to a third condition, the MLC strategy can take a memory cell offline from storing data in order to execute one or more hysteresis loop manipulation that alter at least a portion of a cell's hysteresis loop from a default loop shape, size, and/or position relative to an applied electric field compared to cell polarization.

Figure 11:
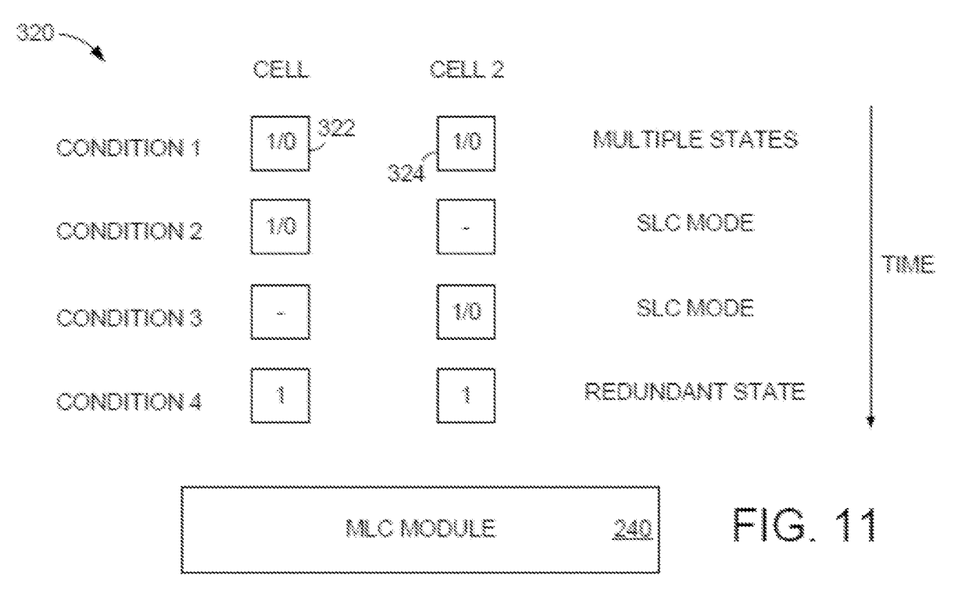
FIG. 11 depicts portions of an example data storage system conducting assorted embodiments.

At the conclusion of the hysteresis loop manipulation actions of the third condition, or in the event the MLC strategy prescribes a different condition order than conveyed in FIG. 10, a fourth condition is entered where all polarizations, and logic states, are available for programming in each memory cell. Some embodiments transition from execution of an MLC strategy to an SLC strategy in response to a predetermined trigger, such as an error rate, failure, or deterministic data performance window. Other embodiments execute an SLC strategy without starting with an MLC strategy. FIG. 11 depicts a block representation of portions of an example data storage system 320 employing read destructive memory cells 322/324 configured as an MLC memory unit that executes an SLC strategy generated by the connected MLC module 240.

A default memory unit operational first condition can have memory cells with each stable polarization available for data storage. It is contemplated that the memory cells 322/324 are individually programmed and individually read. After a predetermined time in the first operational condition, or in response to a detected or predicted condition, such as the presence of wear, one memory cell 324 is taken offline and not available to be programmed or read in a second operational condition. It is contemplated that the memory cell taken offline in the second operational condition is returned to a zero polarization or programmed to a particular polarization conducive to mitigating the proliferation of wear and/or performance degradation.

While the second operational condition can execute one or more hysteresis loop manipulating actions, such actions are not required and the memory unit can employ a single memory cell alone for any amount of time. Some embodiments proceed to a third operational condition where the opposite memory cell 322 is taken offline while the other memory cell 324 is available to be programmed with host-generated data. It is noted that the third operational condition can execute hysteresis loop manipulations, but such actions are not required or limiting to the operational deviations that can be undertaken on the offline memory cell 322.

Various embodiments return to a default first operational condition after the second, or third, operational condition. Other embodiments proceed to a fourth operational condition where a single memory cell 322 is used to program data and the other memory unit memory cell 324 is used to store the same polarization/logic state. The redundant storage of data within a single memory unit can improve data retention and reliability, but at the expense of less data capacity. The ability to utilize a memory unit with multiple memory cells as an SLC that stores one data bit at a time affords time and processing power to conduct assorted wear mitigation activity, such as wear repair, polarization cycling, and artificial data programming, to proactively and/or reactively control cell health degradation. Utilizing a memory unit as an SLC can further allow an MLC module to drastically alter the reliability of data, which can be particularly useful for sensitive, or difficult to recover after an error, data sets.

Figure 12:
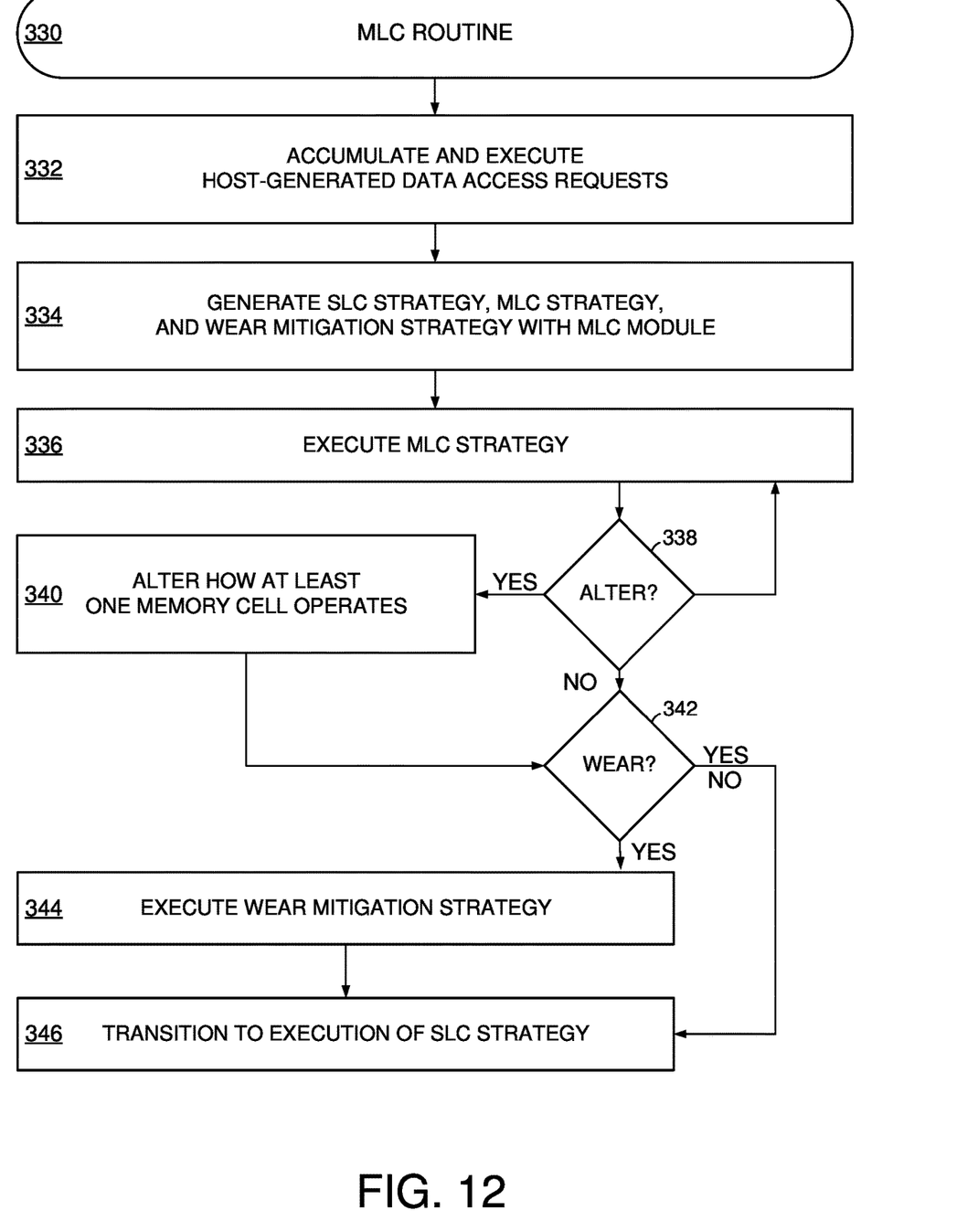
FIG. 12 is a flowchart of an example MLC routine that may be carried out in embodiments of a memory employing read destructive memory cells.

FIG. 12 conveys an example MLC routine 330 that can be practiced by the assorted embodiments of FIGS. 1-11 to intelligently monitor and control read destructive memory cells configured to operate as multi-level memory units. It is contemplated that any number, and type, of memory cells can be employed in a data storage system connected to an MLC module, but various embodiments utilize an array of solid-state multi-level memory units as non-volatile, long-term data storage. Connection of one or more remote hosts to the MLC module and read destructive memory units allows for accumulation and selective execution of host-generated data access requests. Such execution is monitored passively by the MLC module in step 332, which does not involve any module-generated data writing or reading.

The passive monitoring of servicing host-generated data access requests prevents performance degradation as a result of actively testing memory cells/units to determine status, performance, and health. The passive accumulation of memory unit/cell metrics in step 332, such as read latency, write latency, error rate, heat, and power consumption, allows the MLC module to accurately predict future cell/unit condition, health, performance, and wear. With an accurate understanding of current memory cell/unit status and performance, as well as future predicted status and performance, the MLC module can then generate at least an SLC strategy, for when a memory unit will operate as a single level of data storage, an MLC strategy, for when a memory unit will operate with multiple concurrent data bits, and a wear mitigation strategy, for operating parameters to mitigate and/or repair wear conditions in at least one memory cell/unit in step 334.

Some embodiments of step 334 generate strategies specific to a particular memory unit, physical page of memory units, or logical grouping of memory units that customize operating parameters and MLC/SLC condition progression based on passively monitored memory unit status and/or predicted memory unit status based on the passively monitored memory unit metrics. As such, it is contemplated that step 334 generates multiple strategies for different memory units that are concurrently capable of being executed upon detection, or prediction, of a trigger event dictated by the respective strategy, such as accumulation of heat, polarization cycles, or health degradation.

In response to an operational trigger, or passage of time, step 336 can initially execute an MLC strategy for at least one memory unit that prescribes default operating parameters for concurrently storing multiple data bits in memory cells of a single memory unit. While a default MLC operating condition, such as the first condition of FIG. 10, can be carried out for any amount of time, decision 338 can evaluate if a current strategy is to be altered or an operating parameter prescribed by the current strategy is to be altered to improve current, or future, memory cell/unit performance, lifespan, or balance. Upon detection, or prediction, by the MLC of changing operating status for one or more memory units, decision 338 can execute step 340 where at least one operating parameter is altered to proactively, or reactively, change how a memory cell operates. For instance, step 340 can alter reference data read voltages, data write voltages, error correction protocol, refresh rates, availability for new data, and stored polarization to adapt to changing system conditions and provide a predetermined memory cell operational goal (performance/lifespan/balance).

In the event changing system conditions involve the detection, or prediction, of memory cell/unit wear, decision 338 proceeds to decision 342 where the type and severity of wear determined by the MLC module is evaluated. A current, or predicted, wear condition can prompt decision 342 to conduct one or more operational deviations from a wear mitigation strategy in step 344. The execution of wear mitigation strategy actions can repair wear in a memory cell, mitigate the proliferation of wear, mitigate the performance degradation due to wear, or balance performance among different memory cells that are experiencing wear. It is contemplated, but not required, that the wear mitigation strategy induces wear in one or more memory cells/units, such as via the concentration of heat and/or writing of a test data pattern generated by the MLC module.

Some embodiments of the wear mitigation strategy in step 344, or the alteration of operating parameters in step 340, conduct one or more actions to manipulate the hysteresis loop of at least one memory cell. Such hysteresis loop manipulation can optimize memory cell operating capabilities and/or performance with, or without, the presence of wear. The alteration of a memory cell's hysteresis loop can be particularly useful to optimize the separation of stable polarizations in memory units configured as MLCs.

The absence of wear, or a wear condition severe enough to trigger the wear mitigation strategy, causes step 346 to transition from an MLC strategy to an SLC strategy. As conveyed in association with FIG. 11, an SLC strategy can utilize the different memory cells of a memory unit intelligently to store a single data bit. The ability to store data redundantly or take memory cells offline can reduce the risk of wear conditions and consumption of power. It is noted that transition from an MLC strategy to an SLC strategy is not limited to a lack of memory cell wear and can be conducted in response to any predetermined event, such as pending host-generated request queue, cache volume, available power amount, temperature of a memory array, or entrance into a deterministic data window where data read performance is guaranteed within a set range.

With decision 342, the MLC module can evaluate if predicted memory cell/unit wear is great enough to warrant altering cell/unit operating conditions. That is, the MLC module, in decision 342, can determine if predicted wear is likely enough to occur and strong enough to degrade memory cell/unit performance and/or reliability to merit the expense of altering default memory cell/unit operating parameters to control. The ability to intelligently evaluate the presence, or likelihood, of memory cell/unit performance changing over time allows the MLC module to efficiently modify operating parameters to maintain dual data bit storage in a memory unit and/or optimize performance of a memory unit as an SLC. The optimization of dual data bit storage in a memory unit concurrently employing multiple read destructive memory cells allows for greater memory unit operational performance, longevity, and adaptability to changing system, host, and cell status.

What is claimed is:

1. A method comprising:
    programming a non-volatile memory unit with a first logical state in response to a first write voltage of a first hysteresis loop, as directed by a write controller;
    programming the non-volatile memory unit with a second logical state in response to a second write voltage of the first hysteresis loop, the first and second logical states present concurrently in the non-volatile memory unit;
    reading the first and second logical states from the non-volatile memory unit concurrently; and
    testing, with a monitor circuit, the non-volatile memory unit during satisfaction of a host generated data access request to the non-volatile memory unit with an alternate read voltage selected by the monitor circuit.

2. The method of claim 1, wherein the non-volatile memory unit comprises a ferroelectric memory cell and an antiferroelectric memory cell.

3. The method of claim 2, wherein the ferroelectric memory cell is connected to the antiferroelectric memory cell in series.

4. The method of claim 2, wherein the ferroelectric memory cell is connected to the antiferroelectric memory cell in parallel.

5. The method of claim 1, wherein the alternate read voltage is selected to concurrently read at least one logical state from the non-volatile memory unit while indicating if a wear condition is present in the non-volatile memory unit.

6. The method of claim 1, wherein the alternate read voltage is different than a reference voltage used to previously read the first and second logical states from the non-volatile memory unit.

7. The method of claim 1, wherein the alternate read voltage has a greater latency than a reference voltage used to previously read the first and second logical states from the non-volatile memory unit.

8. The method of claim 1, wherein the non-volatile memory unit has a read destructive construction.

9. A method comprising:
    programming a non-volatile memory unit with different first and second logical states, as directed by a write controller, the first logical state corresponding with a first hysteresis loop, the second logical state corresponding with a second hysteresis loop, the first and second logical states each concurrently present in the non-volatile memory unit;
    monitoring, with a monitor circuit, a health of at least one non-volatile memory unit by evaluating logged activity for a first group of non-volatile memory units; and
    predicting, with the monitor circuit, a wear condition is present in a non-volatile memory unit of the first group of non-volatile memory units.

10. The method of claim 9, wherein the monitor circuit changes a monitoring resolution from the first group of non-volatile memory units to a second group of non-volatile memory units, the first group and second group being different.

11. The method of claim 10, wherein the first group consists of a greater number of non-volatile memory units than the second group.

12. The method of claim 10, wherein the first group consists of a lower number of non-volatile memory units than the second group.

13. The method of claim 9, wherein the monitor circuit alters a type of activity logged to monitor the health of the at least one non-volatile memory unit.

14. The method of claim 9, wherein the monitor circuit prescribes a test data access operation to confirm the presence of the predicted wear condition.

15. The method of claim 9, wherein the monitor circuit verifies the presence of the predicted wear condition during subsequent satisfaction of one or more host generated data access requests.

16. A method comprising:
    programming a non-volatile memory unit with different first and second logical states, as directed by a write controller, the first logical state corresponding with a first hysteresis loop, the second logical state corresponding with a second hysteresis loop, the first and second logical states each concurrently present in the non-volatile memory unit;

determining, with a wear circuit, a wear condition is present in the non-volatile memory unit; and altering, with a manipulation circuit, at least one operational parameter of the non-volatile memory unit to mitigate operational degradation corresponding with the wear condition.

17. The method of claim 16, wherein altering the at least one operational parameter returns the first hysteresis loop to a default configuration from a wear configuration corresponding with the wear condition.

18. The method of claim 16, wherein altering the at least one operational parameter increases a margin between logical states in the first hysteresis loop.

19. The method of claim 16, wherein altering the at least one operational parameter changes a configuration of the first hysteresis loop without changing a configuration of the second hysteresis loop.

20. The method of claim 16, wherein altering of the at least one operational parameter proactively customizes operation of the second hysteresis loop to prevent a wear condition from occurring.

\* \* \* \* \*